United States Patent
He et al.

(10) Patent No.: US 12,034,470 B2
(45) Date of Patent: Jul. 9, 2024

(54) RADIO APPARATUS

(71) Applicant: Nokia Solutions and Networks Oy, Espoo (FI)

(72) Inventors: Tian He, Plano, TX (US); Chad Young, Carrollton, TX (US); Shavantha Kularatna, Flower Mound, TX (US)

(73) Assignee: Nokia Solutions and Networks Oy, Espoo (FI)

( * ) Notice: Subject to any disclaimer, the term of this patent is extended or adjusted under 35 U.S.C. 154(b) by 436 days.

(21) Appl. No.: 17/511,191

(22) Filed: Oct. 26, 2021

(65) Prior Publication Data

US 2022/0140858 A1 May 5, 2022

(30) Foreign Application Priority Data

Nov. 2, 2020 (FI) .................................. 20206097

(51) Int. Cl.
*H04B 1/04* (2006.01)
*H03F 1/32* (2006.01)
(Continued)

(52) U.S. Cl.
CPC ............ *H04B 1/62* (2013.01); *H04B 1/0078* (2013.01); *H04B 1/0458* (2013.01); *H04B 2001/0408* (2013.01)

(58) Field of Classification Search
None
See application file for complete search history.

(56) References Cited

U.S. PATENT DOCUMENTS 5,101,173 A 3/1992 DiPiazza et al.
7,817,973 B1 10/2010 Tuo
(Continued)

FOREIGN PATENT DOCUMENTS

CN 107529215 A 12/2017
CN 109088646 A 12/2018
(Continued)

OTHER PUBLICATIONS

Lee et al., "Digital PreDistortion for Concurrent Dual-Band Transmitter with a Single Feedback Path", International Journal of Control and Automation, vol. 10, No. 2, 2017, pp. 303-314.
(Continued)

*Primary Examiner* — Pablo N Tran
(74) *Attorney, Agent, or Firm* — Nokia Technologies Oy (57) ABSTRACT

An apparatus is disclosed, comprising means for providing two or more amplifiers for amplifying signals in two or more respective frequency bands, receiving a composite signal comprising first and second predistorted input signals in first and second frequency bands and filtering the composite signal to provide (i) the first predistorted signal for input to a first amplifier of the two or more amplifiers for producing an amplified first output signal and (ii) the second predistorted signal for input to a second amplifier of the two or more amplifiers for producing an amplified second output signal. The apparatus may also comprise means for routing, at non-overlapping times, the first and second output signals to a common feedback path and for linearizing received first and second input signals based on the respective first and second output signals received on the common feedback path.

15 Claims, 7 Drawing Sheets

(51) Int. Cl.
*H03F 3/24* (2006.01)
*H04B 1/00* (2006.01)
*H04B 1/62* (2006.01)
*H04L 27/36* (2006.01)

(56) References Cited

U.S. PATENT DOCUMENTS

| | | | |
|---|---|---|---|
| 9,338,039 B1 | 5/2016 | Barnes | |
| 10,651,902 B2* | 5/2020 | Guan | H04B 7/0634 |
| 11,025,203 B2* | 6/2021 | Seo | H04L 27/0002 |
| 2009/0184763 A1* | 7/2009 | Kim | H03F 3/68 |
| | | | 330/124 R |
| 2011/0235749 A1* | 9/2011 | Kenington | H04L 25/03343 |
| | | | 375/296 |
| 2012/0083229 A1 | 4/2012 | Kenington | |
| 2012/0200355 A1 | 8/2012 | Braithwaite | |
| 2013/0059546 A1 | 3/2013 | Lum et al. | |
| 2013/0094610 A1* | 4/2013 | Ghannouchi | H03F 3/189 |
| | | | 375/296 |
| 2014/0253231 A1 | 9/2014 | Reinwald et al. | |
| 2014/0292579 A1* | 10/2014 | Oh | H01Q 3/38 |
| | | | 342/372 |
| 2015/0049841 A1 | 2/2015 | Laporte et al. | |
| 2015/0103952 A1* | 4/2015 | Wang | H04B 1/0475 |
| | | | 375/297 |
| 2015/0236731 A1* | 8/2015 | Ghannouchi | H03F 3/245 |
| | | | 375/296 |
| 2016/0269057 A1 | 9/2016 | Chang | |
| 2016/0285485 A1 | 9/2016 | Fehri et al. | |
| 2018/0191314 A1* | 7/2018 | Pratt | H03F 3/19 |
| 2019/0028068 A1* | 1/2019 | Schemmann | H04L 25/0204 |
| 2019/0123702 A1 | 4/2019 | Trainor et al. | |
| 2019/0312613 A1 | 10/2019 | Guan | |
| 2020/0028476 A1 | 1/2020 | Kim et al. | |
| 2020/0195203 A1 | 6/2020 | Braun et al. | |

FOREIGN PATENT DOCUMENTS

| | | | |
|---|---|---|---|
| EP | 2372905 A1 | 10/2011 | |
| WO | WO-2016151518 A1 * | 9/2016 | H04B 1/0475 |
| WO | 2019/032337 A1 | 2/2019 | |
| WO | 2019/110327 A1 | 6/2019 | |
| WO | WO-2021172796 A1 * | 9/2021 | H04B 1/0057 |

OTHER PUBLICATIONS

Liu et al., "Concurrent Dual-Band Digital Predistortion With a Single Feedback Loop", IEEE Transactions on Microwave Theory and Techniques, vol. 63, No. 5, May 2015, pp. 1556-1568.
Office action received for corresponding Finnish Patent Application No. 20206097, dated Mar. 8, 2021, 8 pages.
Office action received for corresponding Finnish Patent Application No. 20206098, dated Mar. 31, 2021, 9 pages.
Extended European Search Report received for corresponding European Patent Application No. 21204635.3, dated Mar. 11, 2022, 9 pages.
Extended European Search Report received for corresponding European Patent Application No. 21205501.6, dated Mar. 21, 2022, 9 pages.

* cited by examiner

RADIO APPARATUS

FIELD

Embodiments relate to a radio apparatus and signal processing methods for the radio apparatus.

BACKGROUND

In the context of wireless radio frequency (RF) networks, operators may enable transmission and/or reception of signals over multiple frequency bands at any given site, e.g. at a base station. For various reasons, an operator may provide multiple radio apparatuses at a given site, each apparatus comprising a high-efficiency power amplifier to cover a particular band. As an alternative, operators may provide a wideband radio apparatus with a wideband power amplifier that covers the required bands. Each option has various benefits and disadvantages.

SUMMARY

The scope of protection sought for various embodiments of the invention is set out by the independent claims. The embodiments and features, if any, described in this specification that do not fall under the scope of the independent claims are to be interpreted as examples useful for understanding various embodiments of the invention.

According to a first aspect, there is described an apparatus comprising means for: providing two or more amplifiers for amplifying signals in two or more respective frequency bands; receiving a composite signal comprising first and second predistorted input signals in first and second frequency bands; filtering the composite signal to provide (i) the first predistorted signal for input to a first amplifier of the two or more amplifiers for producing an amplified first output signal and (ii) the second predistorted signal for input to a second amplifier of the two or more amplifiers for producing an amplified second output signal; routing, at non-overlapping times, the first and second output signals to a common feedback path; and linearizing received first and second input signals based on the respective first and second output signals received on the common feedback path.

The routing means may comprise a digital switch.

The linearizing means may comprise one or more digital predistorters (DPDs).

The linearizing means may comprise first and second DPDs for applying a predistortion to the respective first and second input signals prior to combining, wherein the routing means is configured to route either the first output signal to the first DPD or to route the second output signal to the second DPD.

The routing means may be configured to route the first output signal to the first DPD at a first repeating time interval and to route the second output signal to the second DPD at a second repeating time interval.

Each of the first and second DPDs may comprise first and second sub-models defined by first and second DPD filters, the first and second sub-models being configured to predistort respective first and second subsets of frequency components of the input signal. A technical effect may be to minimize effects to the DPDs due to significant group delay.

The first and second DPD filters may be complementary half-band filters.

The apparatus may further comprise: a common gain controller for controlling the gain of the composite signal; and first and second post-scaling controllers for individually controlling the gain of the respective first and second input signals subsequent to predistortion by the respective first and second DPDs.

The apparatus may further comprise means for determining and applying a common gain adjustment value for the common gain controller based on determining: (i) a first gain error based on comparing the measured power of first output signal with that of the first input signal; (ii) a second gain error based on comparing the measured power of the second output signal with that of the second input signal, and wherein the common gain adjustment value is based on the average of the first and second gain errors.

The apparatus may further comprise means for determining residual first and second gain errors associated with the first and second input signals subsequent to applying the common gain adjustment value.

The apparatus may further comprise means for determining and applying individual gain adjustment values for the respective first and second post-scaling controllers to reduce or substantially remove the residual first and second gain errors.

The apparatus may further comprise means for clipping the respective first and second input signals prior to mixing so as not to exceed a predetermined peak to average value.

The two or more amplifiers may be power amplifiers for connection to a common antenna.

The common antenna may be remote from the apparatus.

The apparatus may comprise a radio module for a radio access network base station.

According to a second aspect, there is described a method comprising: routing, at non-overlapping times, first and second output signals from respective first and second amplifiers to a common feedback path, the first and second amplifiers being for amplifying signals in two or more respective frequency bands; and causing linearizing of received first and second input signals for the first and second amplifiers.

The routing may be performed by controlling a digital switch.

The linearizing may comprise use of one or more digital predistorters (DPDs).

The linearizing may comprise use of first and second DPDs for applying a predistortion to the respective first and second input signals prior to combining, wherein the routing may comprise routing either the first output signal to the first DPD or routing the second output signal to the second DPD.

The routing may comprise routing the first output signal to the first DPD at a first repeating time interval and routing the second output signal to the second DPD at a second repeating time interval.

Each of the first and second DPDs may comprise first and second sub-models defined by first and second DPD filters, the first and second sub-models being configured to predistort respective first and second subsets of frequency components of the input signal. The technical effect may be to minimize effects to the DPDs due to significant group delay.

The first and second DPD filters may be complementary half-band filters.

The method may further comprise: controlling a common gain controller for controlling the gain of the composite signal; and controlling first and second post-scaling controllers for individually controlling the gain of the respective first and second input signals subsequent to predistortion by the respective first and second DPDs.

The method may comprise controlling the common gain controller by determining and applying a common gain adjustment value for the common gain controller based on determining: (i) a first gain error based on comparing the measured power of first output signal with that of the first input signal; (ii) a second gain error based on comparing the measured power of the second output signal with that of the second input signal, and wherein the common gain adjustment value is based on the average of the first and second gain errors.

The method may further comprise determining residual first and second gain errors associated with the first and second input signals subsequent to applying the common gain adjustment value.

The method may comprise controlling the first and second post-scaling controllers by determining and applying individual gain adjustment values for the respective first and second post-scaling controllers to reduce or substantially remove the residual first and second gain errors.

The method may further comprise clipping the respective first and second input signals prior to mixing so as not to exceed a predetermined peak to average value.

The method may be performed in a radio module for a radio access network base station.

According to a third aspect, there is provided a computer program product comprising a set of instructions which, when executed on an apparatus, is configured to cause the apparatus to carry out the method of any preceding method definition.

According to a fourth aspect, there is provided a non-transitory computer readable medium comprising program instructions stored thereon for performing a method, comprising: routing, at non-overlapping times, first and second output signals from respective first and second amplifiers to a common feedback path, the first and second amplifiers being for amplifying signals in two or more respective frequency bands; and causing linearizing of received first and second input signals for the first and second amplifiers.

The program instructions of the fourth aspect may also perform operations according to any preceding method definition of the second aspect.

According to a fifth aspect, there is provided an apparatus comprising: at least one processor; and at least one memory including computer program code which, when executed by the at least one processor, causes the apparatus: to route, at non-overlapping times, first and second output signals from respective first and second amplifiers to a common feedback path, the first and second amplifiers being for amplifying signals in two or more respective frequency bands; and to cause linearizing of received first and second input signals for the first and second amplifiers.

The computer program code of the fifth aspect may also perform operations according to any preceding method definition of the second aspect.

BRIEF DESCRIPTION OF DRAWINGS

Example embodiments will now be described by way of non-limiting example, with reference to the accompanying drawings, in which.

DETAILED DESCRIPTION

Example embodiments relate to a radio apparatus, signal processing methods for a radio apparatus and methods for configuring a radio apparatus.

A radio apparatus may comprise an apparatus configured to transmit and/or receive radio frequency (RF) signals in one or more predefined RF bands, hereafter referred to simply as "bands".

A radio apparatus may be referred to herein as a radio frequency module (RFM). One or more RFMs may be installed by a radio access network (RAN) operator at each of one or more base stations. A RFM may be considered self-contained unit comprising digital and analogue components for receiving and processing baseband input signals for coding, modulation and amplification via one or more power amplifiers, and transmission via an antenna connected to an output port of the apparatus. The RFM may also be configured to receive RF signals for demodulation although this disclosure may focus on the transmission chain. The antenna may be local or remote to the RFM. For example, the RFM may be connected to the antenna via a fibre cable for remote situations.

A RFM may be configured to transmit and/or receive RF signals using multiple (two or more) RF bands. The frequency ranges for uplink and downlink operation, and the centre frequency of a given band, among other parameters, are usually defined in national or international communications standards. For the avoidance of doubt, this disclosure relates to an RFM that is not limited to a particular number of bands, nor any particular type of modulation, radio access technology, standard or even hardware topology. For ease of explanation, this disclosure will focus on an example cellular base station RFM configured to provide two distinct bands for transmission, such as the B25 and B66 bands for 4G LTE. The B25 band has an uplink frequency range of 1850-1915 MHz and a downlink frequency range of 1930-1995 MHz. The B66 band has an uplink frequency range of 1710-1780 MHz and a downlink frequency range of 2120-2200 MHz.

Example embodiments are applicable to other generations of RAN, including 2G, 3G, 5G and future generational systems, and may also be applicable to WiFi and Wimax RFMs.

Figure 1:
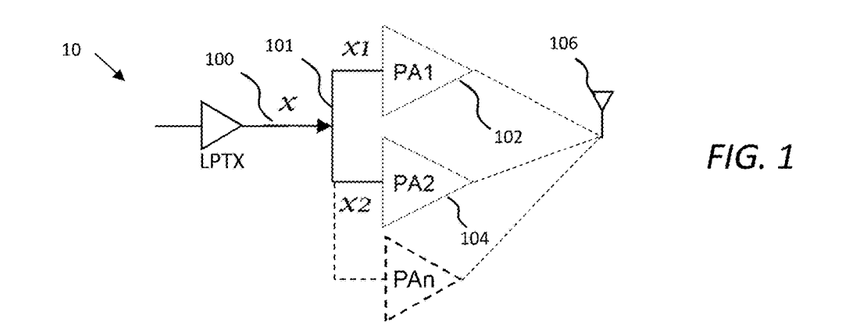
FIG. 1 is a schematic diagram of a circuit topology.

Referring to FIG. 1, a diplexed power amplifier (PA) topology 10 is shown.

The diplexed PA topology 10 comprises a common feed 100 from a so-called Low Power Transmission (LPTX) stage. The common feed 100 provides to a diplexer 101 a low power composite signal x, comprising the sum or combination of signals x1, x2 in, for this example, two different bands. The diplexer 101 may be referred to as a splitter or frequency multiplexer. The diplexer 101 may comprise first and second band pass filters (not shown) for respectively filtering the composite signal x so as to pass a signal x1 for a first band to a first PA 102 and a signal x2 for a second band, different from the first band, to a second PA 104. The first PA 102 and second PA 104 are therefore configured to amplify signals in different respective bands.

The amplified first and second signals may be provided to an RF antenna 106, which may be common to the first and second PAs 102, 104.

The RF antenna 106 may be local or remote to the RFM comprising the FIG. 1 topology. For example, the RF antenna 106 may be some distance from the RFM and connected via a fibre cable.

Example embodiments disclosed herein relate to an RFM based on the FIG. 1 topology 10, or similar. As shown in FIG. 1, the diplexed PA topology 10 is not limited to two PAs and therefore not limited to two bands. Each PA is associated with a particular band and uses a diplexer, or equivalent, comprising filters appropriate to the respective bands. The bands may be set at a commissioning stage when the customer requests the RFM manufacturer to provide an RFM configured for their requirements.

Advantages that follow may include the ability to cover multiple bands in a single RFM using lower-bandwidth PAs which, compared with wideband PAs, inherently have higher efficiencies, for example in terms of power transfer and/or RF emissions. Compared with using multiple RFMs (one per band) there may also be space and cost savings as well as savings relating to maintenance and customization requirements per site. Further advantages will be explained herein.

Figure 2:
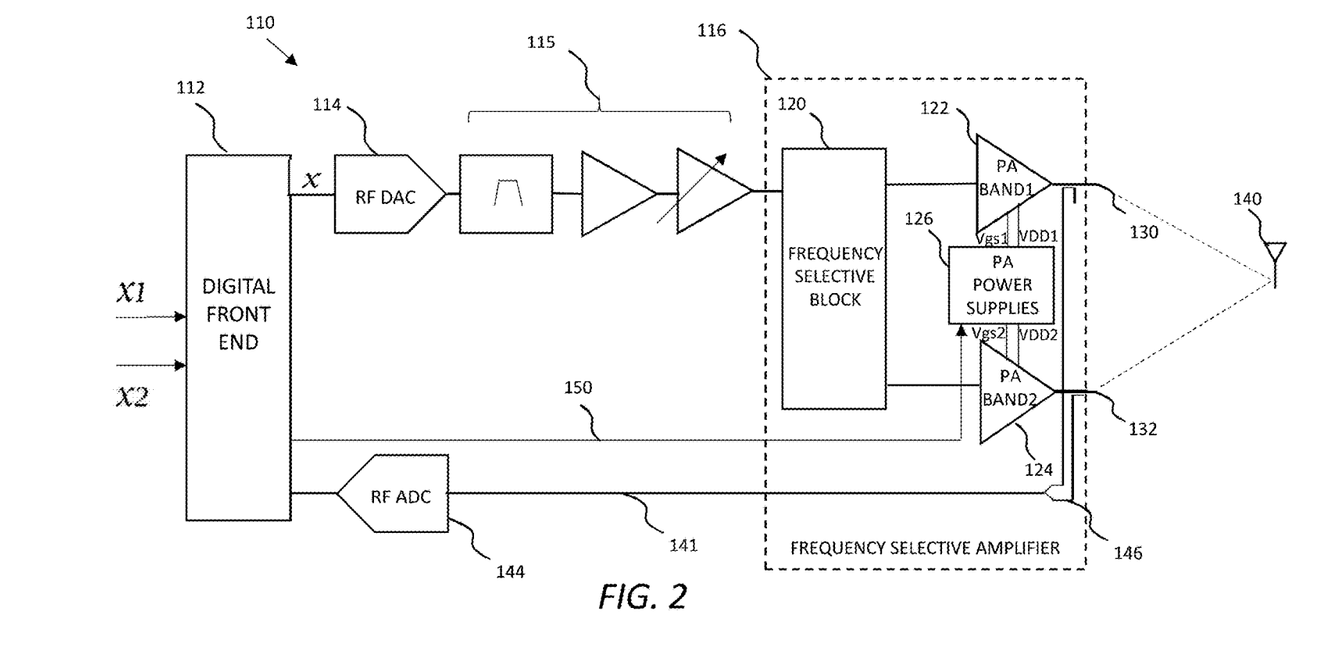
FIG. 2 is a more detailed schematic diagram of a system including a circuit topology according to one or more example embodiments.

Referring to FIG. 2, a schematic diagram of an RFM 110 is shown which is based on the FIG. 1 topology.

The RFM 110 may comprise a digital front end (DFE) 112.

The DFE 112 may comprise one or more digital processing modules, for example one or more Field Programmable Gate Arrays (FPGAs), Application Specific Integrated Circuits (ASICs) or any one or more processors or controllers configured to perform digital signal processing (DSP) operations on respective input signals x1, x2 to be transmitted on the two or more different bands.

An example digital signal processing operation may comprise linearization.

PAs will generally exhibit a nonlinear signal input to output characteristic, particularly for higher output powers. Hence, a linearizing component, commonly referred to as a Digital Predistorter (DPD), is provided to correct or compensate the non-linearity characteristic of the PA. The non-linearity characteristic may be determined based on comparing the PAs input signal (in digital form) to its output signal. The latter is fed back to the DPD for this purpose. The DPD generates a model of the PA's non-linearity characteristic which is essentially a filter model having an associated frequency characteristic or "DPD band". The DPD is said to 'predistort' the input signal effectively as the inverse of the non-linearity characteristic.

Other DSP operations may comprise encoding and/or modulation of input signals using carriers appropriate for the respective bands. In the case where first and second input signals x1, x2 are received for transmission over first and second bands, the DFE 112 may also sum or combine the first and second predistorted and modulated signals x1, x2 to provide the composite signal x which forms an output of the DFE 112.

The composite signal x is provided to an RF Digital to Analogue Converter (DAC) 114, a LPTX stage 115, and then, as shown in FIG. 2, a so-called frequency selective amplifier 116.

The frequency selective amplifier 116 may comprise a so-called frequency selective block (FSB) 120 which may be a diplexer such as that indicated in the FIG. 1 topology, including bandpass filters appropriate to the required first and second (and any additional) bands.

The frequency selective amplifier 116 may also comprise, in this example, first and second PAs 122, 124 respectively associated with first and second bands over which the first and second signals x1, x2 are to be transmitted.

A power supply 126 may provide one or more of d.c. and bias voltages to the first and second PAs 122, 124. Their values may be independent of one another. For example, the power supply 126 may provide a certain drain voltage (VDD1) to the first PA 122 and the same or a different drain voltage (VDD2) to the second PA 124. For example, the power supply 126 may provide a certain gate bias voltage (Vgs1) to the first PA 122 and the same or a different gate voltage (Vgs2) to the second PA 124.

The d.c. and/or bias voltages to the first and second PAs 122, 124 may be controlled by the DFE 112. Particularly, a controller of the DFE 112 may control the particular voltages via a control line 150.

The outputs of the first and second PAs 122, 124 may be connected to respective output ports 130, 132 for connection to an RF antenna 140 as shown. The RF antenna 140 does not necessarily comprise part of the RFM 110.

The outputs of the first and second PAs 122, 134 may also be fed-back to the DFE 112 using a common feedback line 141, via an RF Analogue to Digital Converter (ADC) 142, to provide a reference signal for the DPD as mentioned above. A switch 146 may be provided for this purpose, for example configured so that only one respective output of the first and second PAs 122, 124 is connected to the common feedback line 141 at a given time.

Note that the RFM 110 shown in FIG. 2 is shown with transmission-related components only. It should be understood that the RFM 110 may also receive signals using the RF antenna 140 for demodulation by the DFE 112.

Figure 3:
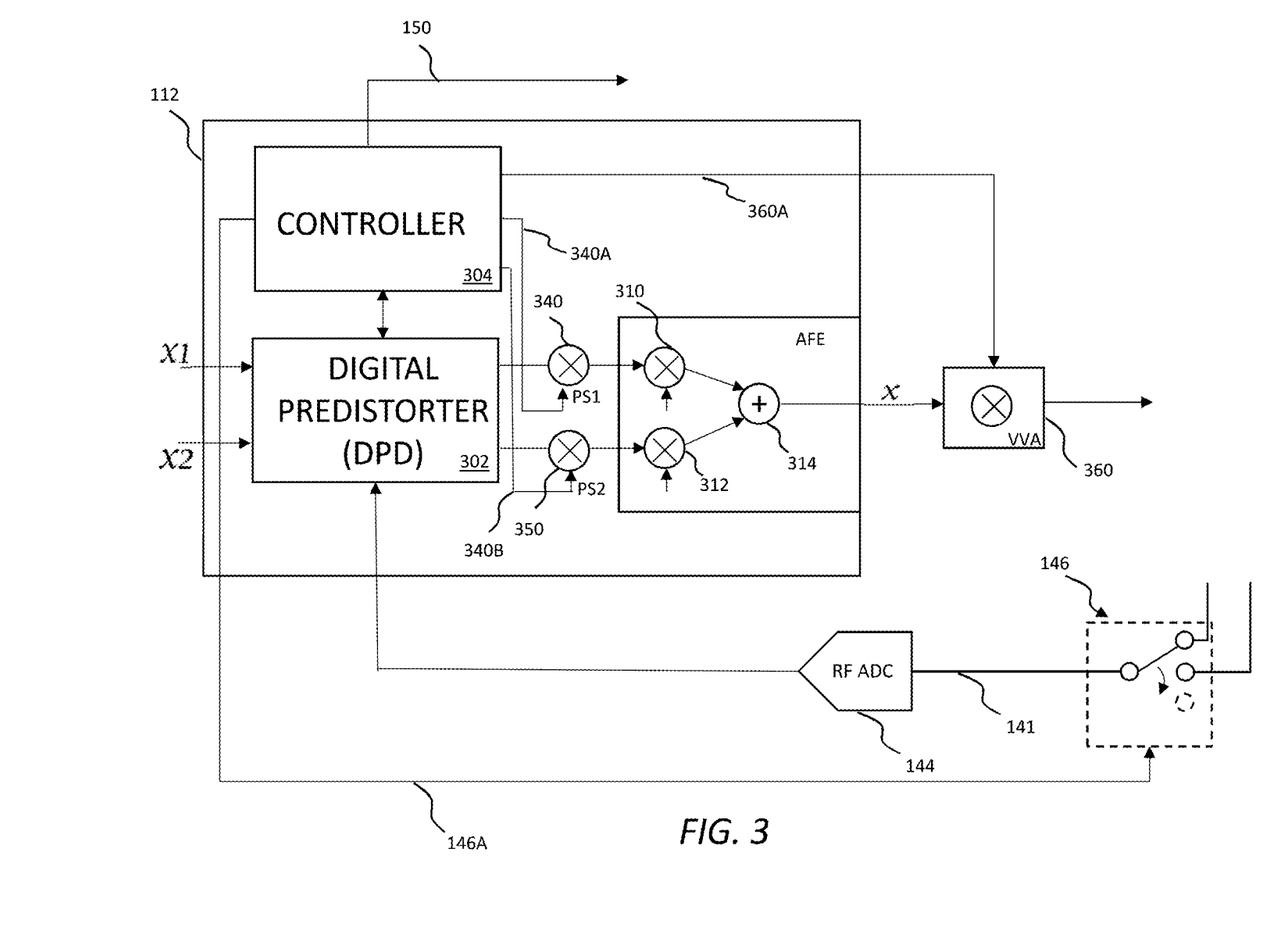
FIG. 3 is a block diagram of a processing module of the FIG. 2 circuit topology according to one or more example embodiments.

FIG. 3 is a block diagram showing some components of the DFE 112.

The DFE 112 may comprise a DPD 302. The DPD 302 may be a dedicated processor or controller, or may be some processing engine embedded within the DFE. The DPD 302 implements one or more computational algorithms for modelling the inherent nonlinearity of each of the first and second PAs 122, 124, and based on said models, performing predistortion of the input signals x1, x2 using the corresponding models to counter the nonlinearities.

As indicated above, the common feedback line 141 provides a reference signal to the DPD 302 from, at a particular time, one of the first and second PAs 122, 124. For example, a reference signal based on the output of the first PA 122 is compared with the corresponding input signal x1 to determine, in effect, the transfer function of the first PA. This may generate a first DPD model. For example, a reference signal based on the output of the second PA 124 is compared with the corresponding input signal x2 to determine, in effect, the transfer function of the second PA. This may generate a second DPD model.

The DPD 302 is therefore configured to generate inverse functions of the first and second DPD models for predistorting the first and second signals x1, x2. The DPD 302 may implement one DPD algorithm or separate DPD algorithms, one for each of the first and second PAs 122, 124 based on their respective bands. Each DPD model will have a respective DPD band which covers the band of its corresponding PA.

The predistorted first and second signals x1, x2 generated by the DPD 302 then pass through respective elements referred to herein as first and second post scalers 340, 350 and then to respective modulator elements 310, 312 for the first and second bands. The first and second signals x1, x2 are then summed or combined at an element 314 to provide the composite signal x. The composite signal x is then routed to the RF DAC 114 and subsequent LPTX 115. A further element referred to herein as a variable voltage attenuator (VVA) 360 is provided in the analogue domain prior to the LPTX 115.

The purpose and operation of the first and second post scalers 340, 350 and the WA 360 is explained below.

The composite signal x can be any of, but is not limited to, LTE+LTE, LTE+GSM, LTE+WCDMA or LTE+5G NR carrier radio access technologies.

The DFE 112 may also comprise a controller 304.

In some embodiments, the controller 304 may be a dedicated processor separate from the DFE 112. The controller 304 may be configured by means of hardware, software or firmware to perform certain processing functions within, or in association with, the RFM 110.

As shown in FIG. 3, the controller 304 may be connected, via control lines 340A, 340B, to each of the first and second post scalers 340, 350, and via a control line 360A to the WA 360, for controlling their respective operations. The controller 304 may also be connected via a control line 146A to the switch 146.

Bearing in mind that the diplexed topology presents various signal processing challenges, various ones of the above-described components will now be described in greater detail.

DPD 102

Given the FIG. 1 and FIG. 3 topologies which comprise two or more PAs 102, 104, 122, 124 the DPD 302 may be configured to provide an independent DPD engine (i.e. algorithm and/or model) per PA/band. Thus, the first input signal x1 may be linearized by a first DPD engine, independently of a second DPD engine for linearizing the second input signal x2.

Figure 4:
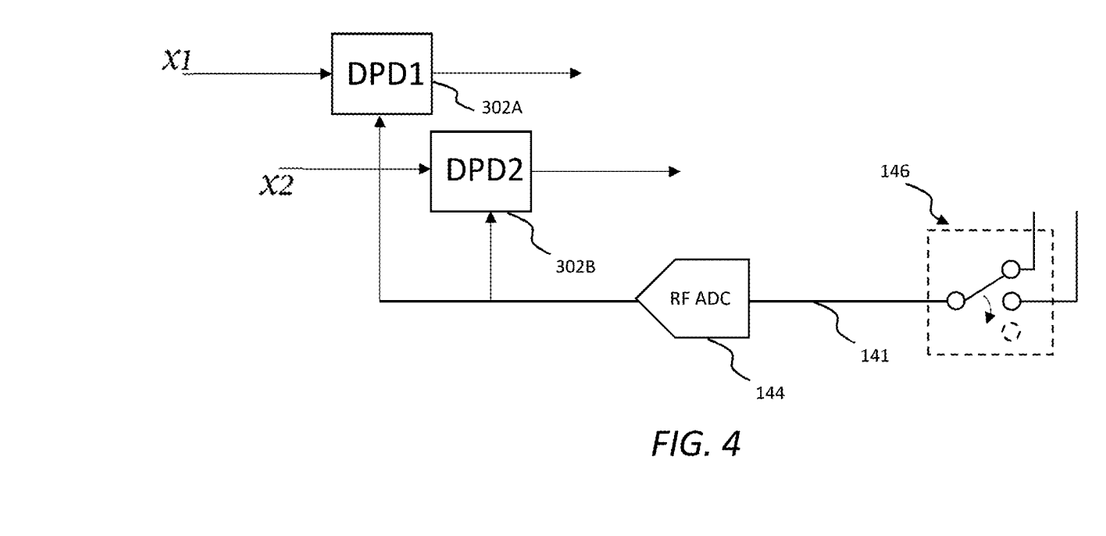
FIG. 4 is a schematic diagram of part of system comprising first and second digital predistortion engines according to one or more example embodiments.

FIG. 4 shows the connection between the common feedback line 141 and first and second DPD engines DPD1 302A, DPD2 302B.

Peak to Average Ratio (PAR)

The Peak to Average Ratio (PAR) of a signal will directly impact DPD performance. A higher PAR may result in increased non-linearity to the system. So, keeping the PAR relatively low is a design goal.

Conceptually, the composite signal x comprises two sub-band signals, for example x1 for band 25 and x2 for band 66 etc. In a general case, the composite signal x may consist of n components for an n band multiplex design. However, the following example illustration here is for a diplexed topology only. It can be said that:

$$x = x1 + x2 \quad (1)$$

Composite signal x may require its peak to be clipped in order to reduce the peak power requirement on the downlink chain, most importantly for the PAs 122, 124.

For a diplexed topology, there are two possible options for clipping the composite signal x. The first is to clip the composite signal x itself, whereby the composite signal passing through the LPTX 115 is well controlled in terms of its peak-to-average ratio (PAR). However, the sub-band signals x1, x2 pass through the first and second Pas 122, 124 will experience a much higher PAR. For example, if the PAR of x is 7.5 dB, then the PAR of x1 or x2 could be 10.5 dB, assuming x1 and x2 to be of equal power. The second option is to clip x1 and x2 separately. This means that the sub-band signals x1, x2 will be well controlled in terms of PAR. However, the signal passing through the LPTX 115 will have an increased PAR. If the PAR of x1 and x2 are both 7.5 dB, and they have the same average power, the PAR of x could be 10.5 dB Hence, there is a choice as to whether to drive the LPTX 115 harder or to drive the first and second PAs 122, 124 harder. The more reasonable and the cost-effective choice is the former. Note that it is much easier to increase the power headroom of the LPTX 115 compared to that of the first and second PAs 122, 124. Hence, as far as clipping is concerned, x1 and x2 are two separate signals. x1 and x2 are clipped to a specified PAR threshold.

Common Feedback to DPD 302

As noted above, the outputs of the first and second PAs 122, 124 may be fed-back to the DFE 112 using a common feedback line 141, via an RF Analogue to Digital Converter (ADC) 144, to provide the reference signal for the first and second DPD engines that are proposed herein. This offers a convenient and cost-effective solution reducing the need for additional hardware.

A routing means such as a switch 146 may be provided for this purpose. The switch may, for example, be configured such that only one respective output of the first and second PAs 122, 124 is connected to the common feedback line 141 at a given time. Put another way, the outputs of the first and second PAs 122, 124 are routed, at non-overlapping times, to the common feedback line 141.

A detailed view of the switch 146 is shown in FIG. 3. The switch 146 may be a digital switch or a multiplexer, or it may be an analogue switch. The switch 146 may be configured to route the first output signal to the first DPD at a first repeating time interval and to route the second output signal to the second DPD at a second repeating time interval. However, other options are available. For example, a user may manually control the switch 146 to route the first and second signals based on ad-hoc requirements.

In this way, the first and second output signals from the first and second PAs 122, 124 are not combined which might introduce undesirable signal interferences, such as adding inter-modulation (IM) products from one path to the other. At any given time, only a single one of the first and second PAs 122, 124 should be routed to the DPD 302. For efficient DPD operation, signals or signal components that do not need to be corrected should not appear in the feedback signal. Unwanted IM products from, for example, the second band need not be used for correcting the first band. This would add noise causing degradation to the DPD model. For example, B66 signals placed at 2115 MHz and 2185 MHz may cause a fifth order product to interfere at 1975 MHz in B25.

Diplexer-Induced Issues for DPD 202

The diplexer filters of the FSB 120 needs to cover frequencies where DPD correction is desired. This may include the transmit band and the receive band where significant transmit IM products fall, usually to one side of IM3. The diplexer filters also need to reject the other transmit bands sufficiently. This poses a significant problem for cases where the transmit bands are close to each other. Specifically, B25/B66 is one such example where the large rejection of the other transmit band does not lend itself to cover the frequencies between B25 and B66.

Consequently, B25 upper-side IM products will largely be in the roll-off region, or the rejection region of the B25 filter, and B66 lower-side IM products will largely be in the roll-off region, or the rejection region of the B66 filter.

The first and second DPD engines 302A, 302B then will not attempt to generate a predistortion signal in between the B25 and B66 frequencies, except for a small region immediately adjacent to them. This means that, if we consider the predistortion signal at the input of the diplexer, focusing on the region between the B25 and B66 frequencies, we will only see significant frequency components close to each transmit band. No correction will be anticipated for a large part of the frequencies in-between the bands.

The diplexer filters have inherent unavoidable resonances beyond the passband edges that would lead to overshoot of group delay by ~10 ns. This is not desirable for the first and second DPD engines 302A, 302B. Areas of high group delay need to be excluded from the correction bands. Even with such avoidance, the DPD algorithms are still exposed to higher group delay than usual. Hence, a modified DPD algorithm comes to play here which is able to tolerate a higher group delay.

A split-band DPD engine is proposed for each of the first and second DPD engines 302A, 302B. For simplicity the derivation is limited to a split of two. However, the concept and principles are applicable to other multi split cases also.

The principle is that, because group delay variation is large within the DPD bandwidth, but changes smoothly, it is possible to "divide and conquer" by splitting a single DPD model in frequency into multiple sub-models. In this way, each sub-model of a given DPD engine 302A, 302B deals with a smaller group delay variation.

Conceptually, let a single DPD model be represented by:

$$X\theta \approx y \quad (2)$$

Then, for example, complementary half-band filters $f_1$ and $f_2$ can be applied to (1) to obtain two DPD sub-models:

$$f_1(X\theta_1) \approx f_1(y) \quad (3)$$

$$f_2(X\theta_1) \approx f_2(y) \quad (4)$$

$$f_1 + f_2 = \text{identity function} \quad (5)$$

Equations (3)-(5) represent a mathematical formulation of a split band DPD model.

Equation (2) is the basis of a single-band DPD model, commonly used in the industry. The following paragraphs describe equation (2) with limited terms.

Terms that describe the single-band DPD can contain linear, $3^{rd}$ order, $5^{th}$ order and $n^{th}$ order memory polynomials. To preserve simplicity, the description below is limited up to the $5^{th}$ order memoryless terms only, while a practical application will consist of higher order terms with memory. The idea could be implemented using piecewise non-linear sections (commonly known as splines). Splines will inherent very high orders and the user will therefore need to incorporate terms with memory to it.

Shown below is a matrix X, where the columns of X denote the linear, $3^{rd}$ and $5^{th}$ order memoryless terms. Each row comprises the respective terms, sampled at a specific time instance. The matrix X consist of n rows that represent n instances of time. In representing a composite signal with finite length n, $x=[x(1), x(2), \ldots, x(n)]^T$, where T represents the transpose.

The matrix X is defined as follows, $$X = [x \; x|x|^2 \; x|x|^4] = \begin{bmatrix} x(1) & x(1)|x(1)|^2 & x(1)|x(1)|^4 \\ \vdots & \vdots & \vdots \\ x(n) & x(n)|x(n)|^2 & x(n)|x(n)|^4 \end{bmatrix}$$

However, in another formulation the terms can be filtered on the time axis (along the column). Such a filtering methodology is commonly known as basis function filtering.

The coefficient vector is denoted by $\theta$. Note that with higher orders and memory, the vector $\theta$ will be much larger.

$$\theta = [\theta_1, \theta_2, \theta_3]^T$$

Correspondingly, the desired output that needs to be modelled is given by:

$$y = [y(1), y(2), \ldots, y(n)]^T$$

Equations (3) to (5) describe the split band DPD engine in accordance with example embodiments. Note that that each column in the matric X as a signal can be filtered to generate another signal of the same length. Since filtering is a linear operation on signals, it can be represented by a linear function. A linear function on a signal of finite length can be represented by a matrix, and consequently all the usual matrix operations will apply.

For example:

$$f_1(X\theta_1) = f_1(X)\theta_1 = X_1\theta_1$$

$$f_2(X\theta_2) = f_2(X)\theta_2 = X_2\theta_2$$

Consequently, filters may be applied to each column of X.

Complementary filters $f_1$ and $f_2$ may be defined, so that for any generic composite signal z, $$f_1(z) + f_2(z) = z$$

A primary candidate for the filters $f_1$ and $f_2$ are complementary half-band filters. However, there are other forms of complementary filters as well, which are power and magnitude based complementary forms and are also applicable herein. In general, complementary filters can be complex, achieving a split which can occur at any point in the frequency axis.

For example, for "split band 1", we may define $X_1$ as the matrix associated with split band 1. Note how the non-linear terms are filtered with the complementary filter $f_1$. Filtering occurs on the time domain samples per each term (per column).

$$X_1 = f_1(X) = [f_1(x) \; f_1(x|x|^2) \; f_1(x|x|^4)]$$

$$y_1 = f_1(y)$$

The least square problem is:

$$X_1\theta_1 \approx y_1$$

Solving for $\theta_1$ is identical to that of the single band option.

For example, for "split band 1", we may define $X_2$ as the matrix associated with "split band 2". Note how the non-linear terms are filtered with the complementary filter $f_2$. Filtering occurs on the time domain samples per each term (per column).

$$X_2 = f_2(X) = [f_2(x) \; f_2(x|x|^2) \; f_2(x|x|^4)]$$

$$y_2 = f_2(y)$$

The least square problem is:

$$X_2\theta_2 \approx y_2$$

Solving for $\theta_2$ is identical to that of the single band option.

The example above shows a single band can be split into two independent DPD engines. Both DPD split bands are solved independently thus, accommodating a wider frequency span to two smaller frequency spans. In an alternative formulation the matrices $X_1$ and $X_2$ can be combined to a single matrix, thus solving for both engines at once.

This idea is shown below:

$$[X_1, X_2]\theta \approx y$$

The concept is not limited to the terms shown above in X. The terms shown above are for illustration.

For example, the user may pursue additional terms that represent cross products of the form $x_1|x_2|^{2n}$ to improve performance.

Experimental Verification

Consider a two-carrier LTE 5G band with 65 MHz spacing tested on a typical B25 80 W PA used for macro radio, with the diplexer (of the FSB 120) connected between the LPTX 115 and, say, the first PA 122. The DPD bandwidth needs to cover both the B25 transmit band (1930 MHz-1995 MHz), and the B25 receive band (1850 MHz~1915 MHz).

The diplexer may be configured to cover these bands only.

The comparison of a single-band DPD engine 302 to split-band engine 302A is shown in Table 1.

TABLE 1

| | | | | | DPD performance | | |
|---|---|---|---|---|---|---|---|
| Diplexer | DPD engine | FB BW (MHz) | DPD center f (MHz) | Adjacent Channel Power (dBc) | Spectrum Emissions Mask (SEM) (dBm/MHz) | Effective SEM (dBm/MHz) | IM3L (dBc) |
| Without | Single-band | 270 | 1962.5 | −59.29 | −18.24 | −19.64 | −58 |
| Without | Split-band | 270 | 1962.5 | −61.12 | −20.11 | −21.51 | −60 |
| With | Single-band | 270 | 1962.5 | −51.11 | −10.34 | −11.74 | −46 |
| With | Split-band | 270 | 1962.5 | −53.93 | −13.63 | −15.03 | −48 |
| With | Single-band | 160 | 1942.5 | −60.04 | −19.15 | −20.55 | −57 |
| With | Split-band | 160 | 1942.5 | −62.27 | −21.70 | −23.10 | −59 |

The first two rows show results for a standard DPD bandwidth of 270 MHz without a diplexer. Such a case is only possible if a dedicated LPTX and PA chain is used for B25 and B66 respectively, unlike the topologies shown in FIGS. 1 and 2. Even here, introducing a split band DPD itself provides a gain of 1.87 dB (−19.64 dBm/MHz−(−21.51 dBm/MHz)) over the standard single band DPD engine.

Figure 5:
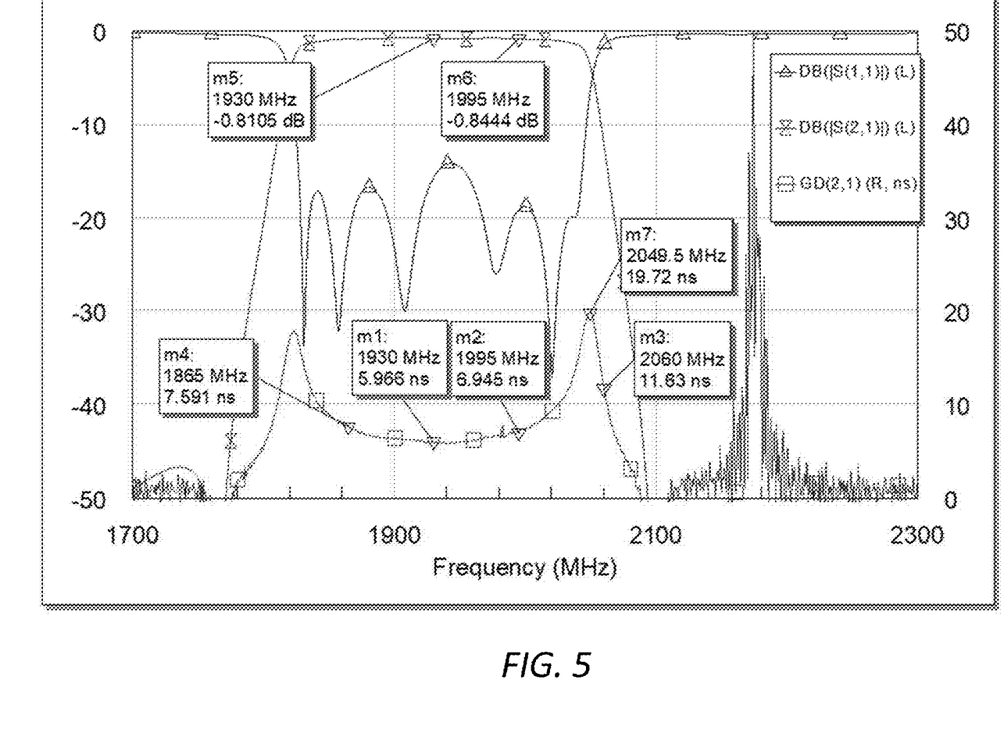
FIG. 5 is a graph useful for explaining how a digital predistortion algorithm may be exposed to severe group delay including resonance peaks.

The third and fourth rows show results for a traditional DPD algorithm with a DPD bandwidth of 270 MHz when a diplexer is placed between the LPTX 115 and the PA 122. Here, as shown in row 3, the single band DPD algorithm degrades dramatically. However, the split band in row 4 is able to improve the result by 3.37 dB (−11.74−(−15.03)) over the standard, single band DPD engine. In row 4, the DPD algorithm is exposed to severe group delay including resonance peaks, as indicated in FIG. 5. We can assume that 1.87 dB of the 3.37 dB gain was due to the split band itself when the additional group delay is not present. Rows 3 and 4 explain how the example embodiment is able to tolerate large group delays. Example embodiments may not be exposed to a wider bandwidth of 270 MHz. Rather, the exposure is only limited to the transmit passband and the receive passband only.

Thus, in a practical case, the DPD engine will be operational with a limited DPD bandwidth of 160 MHz as reflected in rows 5 and 6. This may be quite adequate for linearizing the important frequencies per each band. Group delay exposure is also low within 160 MHz bandwidth. Hence, an improvement of the single band DPD is also shown in row 5. Row 6 shows the result of the example embodiments described above where an improvement of 2.55 dB is seen over the single band DPD. This improvement is less when compared to rows 3 and 4 which is because, for these experiments, the system was not exposed to severe group delay in order to obtain a better absolute dBm/MHz emission number. Choosing an optimum DPD bandwidth is an iterative process with the final dBm/MHz in mind.

Gain Control

Gain control is an inherent part of a DPD algorithm. Gain control is required for power accuracy of the PA output, positioning the DPD signal within the digital dynamic range and monitoring stability of the DPD algorithm in case a temporary DPD model error occurs.

In traditional DPD architectures, one gain control entity is provided. By using a diplexed topology, as in the examples of FIGS. 1 and 2, half of the RF chain is serving both PAs 122, 124, while the remaining RF part is split to serve each PA independently. A particular solution is required.

Figure 6:
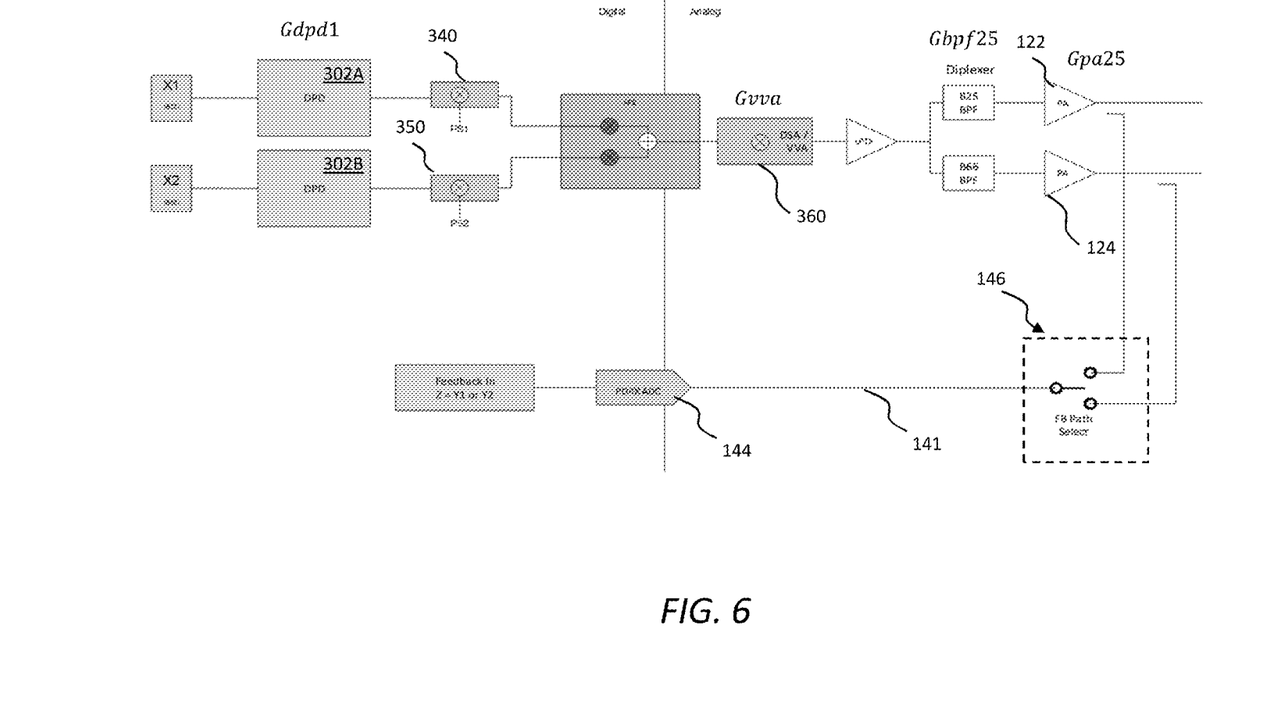
FIG. 6 is a simplified version of the FIG. 2 schematic diagram.

FIG. 6 is a simplified version of the FIG. 2 topology, showing the two DPD engines 302A, 302B, the first and second post scalers 340, 350 and the WA 360.

The WA 360 provides a single, analogue domain component for controlling the inputs of both the first and second PAs 122, 124. Although simple, it may not be sufficient to address statistical differences that one can expect from the first and second PAs 122, 124. Statistical differences are random in nature, but PA gain impacts due to environmental changes may also be different for both PAs. Hence the first and second (digital) post scalers 340, 350 are provided and controlled to overcome the uncorrelated residual gain shifts of the first and second PAs 122, 124.

The controller 304 of the DFE 112 is configured to set gain control (adjustment) values for the WA 360 and the first and second post scalers 340, 350 based on, for example, equations below.

Equations 6a and 6b show a mathematical form of the GC algorithm for the first PA 122, while equations 7a and 7b show the same for the second PA 124.

In some embodiments, only the first and second post scalers 340, 350 need to be modified while the common VVA can be kept constant, preserving the simplicity.

The following definitions apply to equations 6a and 6b. FIG. 6 also indicates where certain terms are derived, for which see the italicised text.

x1: Un predistored signal per diplexer path 1
Gdpd1: DPD gain per diplexer path 1
Gvva: Common WA for both diplex paths
Gbpf25: Gain of bandpass filter for diplexer path 1
Gpa25: Gain of the Band 25 PA scaler1 Feedback calibration Similar definitions apply for equations 7a and 7b.

$$Y1=(x1+Gdpd1+Gps1+Gvva+Gbpf25+Gpa25) \quad (6a)$$

$$error1=Y1*scaler1-x1 \quad (6b)$$

$$Y2=(x2+Gdpd2+Gps2+Gvva+Gbpf66+Gpa66) \quad (7a)$$

$$error2=Y2*scaler2-x2 \quad (7b)$$

The controller 304 may operate as follows.

Step 1: values for scaler1 and scaler2 may be calibrated to a known rated power level such that the values of error1 and error2 shown in equations 6b and 7b will be zero. Gps1, Gps2 and Gvva are fixed during this operation.

Step 2: with the RFM 110 powered up, RF software will compute the mean of error1 and error2.

The average or midpoint for error1 and error2 can be computed:

$$VVA\ adjustment=(mean(error1)+mean(error2))/2.$$

The controller 304 may set the WA adjustment to the WA 360 as follows:

$$New\ VVA=old\ VVA+VVA\ adjustment$$

The controller 304 accounts for the fact that one diplex path may be slightly overpowered from the target power and the other may be slightly underpowered from the target power.

Step 2 ensures power errors of both paths will be at, or close to, a minimum. However, residual power error (over and under power from the target) is not handled. For this reason, the controller 304 requires to control the first and second post scalers 340, 350 using values of Gps1_adjsutment and Gps2_adjsutment to ensure the power of the diplex paths are now accurate.

Step 2 indicates an embodiment where the mean error powers are computed to bring diplex path powers close to the targeted power. However, in another embodiment max (error1, error2) can also be used to adjust the WA 360. This brings the path with the maximum power to the targeted power value, while the other path will be underpowered, which can be adjusted by the corresponding post scaler 340, 350.

There may be numerous gain control algorithms conforming to the architecture shown in FIG. 6.

Figure 7:
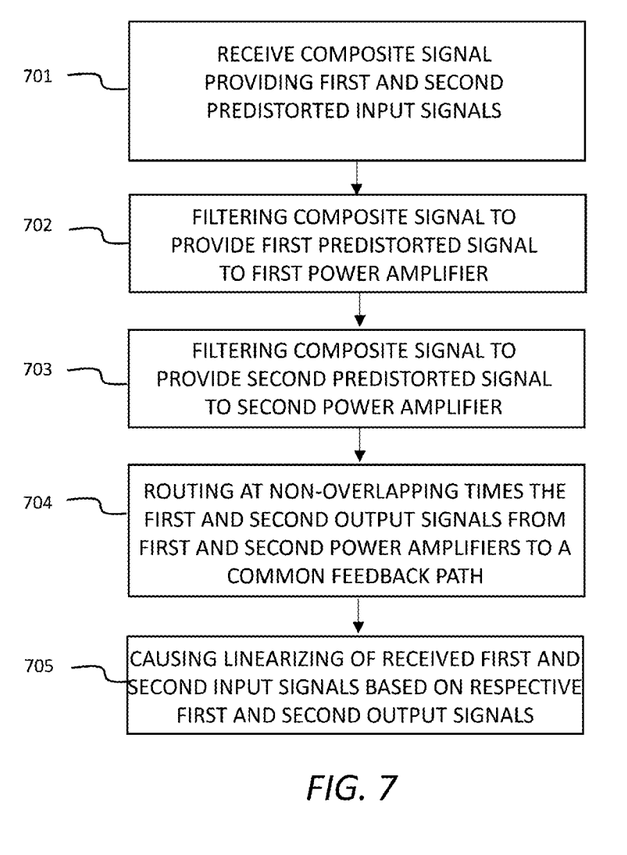
FIG. 7 is a flow diagram indicative of processing steps according to one or more example embodiments.

FIG. 7 is a flow diagram showing processing operations that may be performed, for example by the controller 304 or any one or more elements of the DFE 112 in combination. In an example embodiment, the controller 304 may perform at least the fourth and fifth operations relating to routing and causation of linearization.

A first operation 701 may comprise receiving a composite signal comprising first and second predistorted input signals in first and second frequency bands.

A second operation 702 may comprise filtering the composite signal to provide the first predistorted signal for input to a first amplifier for producing an amplified first output signal.

A third operation 703 may comprise filtering the composite signal to provide the second predistorted signal for input to a second amplifier for producing an amplified second output signal.

A fourth operation 704 may comprise routing, at non-overlapping times, the first and second output signals to a common feedback path.

A fifth operation 705 may comprise causing linearizing received first and second input signals based on the respective first and second output signals received on the common feedback path.

Figure 8:
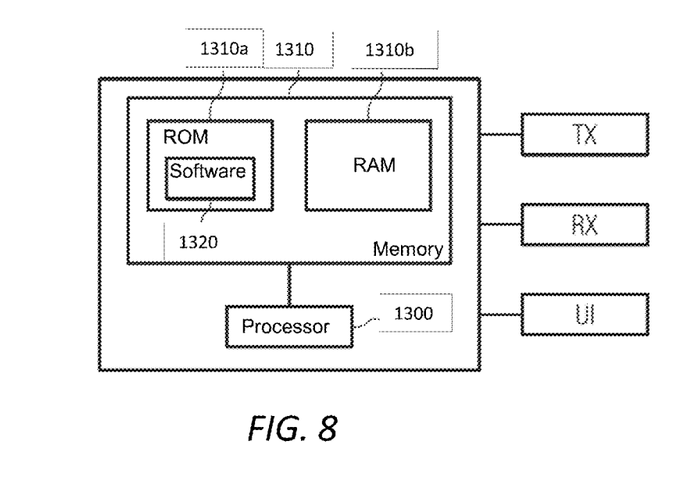
FIG. 8 is a schematic view of an apparatus which may be configured to perform operations according to one or more example embodiments.

FIG. 8 shows an example apparatus that may comprise, for example, the controller 304 or any processing element of the DFE 112.

The apparatus may comprise at least one processor 1300 and at least one memory 1310 directly or closely connected or coupled to the processor. The memory 1310 may comprise at least one random access memory (RAM) 1310a and at least one read-only memory (ROM) 1310b. Computer program code (software) 1320 may be stored in the ROM 1310b. The apparatus may be connected to a transmitter path and a receiver path in order to obtain respective signals or data. The apparatus may be connected with a user interface (UI) for instructing the apparatus and/or for outputting data. The at least one processor 1300 with the at least one memory 1310 and the computer program code 1320 may be arranged to cause the apparatus to at least perform methods described herein.

The processor 1300 may be a microprocessor, plural microprocessors, a microcontroller, or plural microcontrollers.

The memory may take any suitable form.

Figure 9:
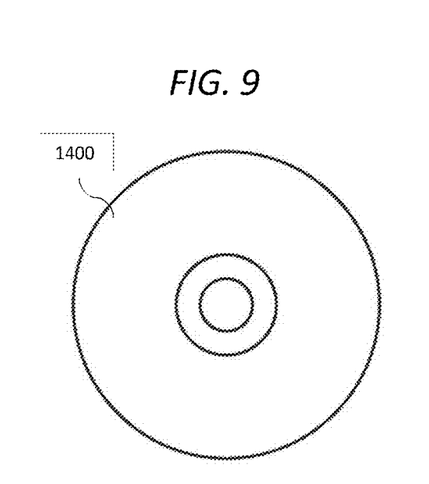
FIG. 9 is a non-transitory storage medium for storing computer-readable code for performing operations according to one or more example embodiments.

FIG. 9 shows a non-transitory media 1400 according to some embodiments. The non-transitory media 1400 is a computer readable storage medium. It may be e.g. a CD, a DVD, a USB stick, a blue ray disk, etc. The non-transitory media 1400 stores computer program code causing an apparatus to perform operations described above when executed by a processor such as processor 1300 of FIG. 8.

Any mentioned apparatus and/or other features of particular mentioned apparatus may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some examples, a particular mentioned apparatus may be pre-programmed with the appropriate software to carry out desired operations, and wherein the appropriate software can be enabled for use by a user downloading a "key", for example, to unlock/enable the software and its associated functionality. Advantages associated with such examples can include a reduced requirement to download data when further functionality is required for a device, and this can be useful in examples where a device is perceived to have sufficient capacity to store such pre-programmed software for functionality that may not be enabled by a user.

Any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

Any "computer" described herein can comprise a collection of one or more individual processors/processing elements that may or may not be located on the same circuit board, or the same region/position of a circuit board or even the same device. In some examples one or more of any mentioned processors may be distributed over a plurality of devices. The same or different processor/processing elements may perform one or more functions described herein.

The term "signalling" may refer to one or more signals transmitted as a series of transmitted and/or received electrical/optical signals. The series of signals may comprise one, two, three, four or even more individual signal components or distinct signals to make up said signalling. Some or all of these individual signals may be transmitted/received by wireless or wired communication simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/examples may consist of any such individual feature or combination of features. In view of the foregoing description it will be evident to a person skilled in the art that various modifications may be made within the scope of the disclosure.

While there have been shown and described and pointed out fundamental novel features as applied to examples thereof, it will be understood that various omissions and substitutions and changes in the form and details of the devices and methods described may be made by those skilled in the art without departing from the scope of the disclosure. For example, it is expressly intended that all combinations of those elements and/or method steps which perform substantially the same function in substantially the same way to achieve the same results are within the scope of the disclosure. Moreover, it should be recognized that structures and/or elements and/or method steps shown and/or described in connection with any disclosed form or examples may be incorporated in any other disclosed or described or suggested form or example as a general matter of design choice. Furthermore, in the claims means-plus-function clauses are intended to cover the structures described herein as performing the recited function and not only structural equivalents, but also equivalent structures.

The invention claimed is:

1. An apparatus comprises:
two or more amplifiers to amplify signals in two or more respective frequency bands;
a receiver to receive a composite signal comprising first and second predistorted input signals in first and second frequency bands;
a filter to filter the composite signal to provide (i) the first predistorted signal for input to a first amplifier of the two or more amplifiers to produce an amplified first output signal and (ii) the second predistorted signal for input to a second amplifier of the two or more amplifiers to produce an amplified second output signal;
a router to route, at non-overlapping times, the first and second output signals to a common feedback path; and
a linearizer to linearize received first and second input signals based on the respective first and second output signals received on the common feedback path;
wherein the apparatus further comprises:
a common gain controller to control the gain of the composite signal; and
first and second post-scaling controllers to individually control the gain of the respective first and second input signals.

2. The apparatus of claim 1, wherein the router comprises a digital switch.

3. The apparatus of claim 1, wherein the linearizer comprises one or more digital predistorters (DPDs).

4. The apparatus of claim 3, wherein the linearizer comprises first and second DPDs for applying a predistortion to the respective first and second input signals prior to combining, wherein the router is configured to route either the first output signal to the first DPD or to route the second output signal to the second DPD.

5. The apparatus of claim 4, wherein the router is configured to route the first output signal to the first DPD at a first repeating time interval and to route the second output signal to the second DPD at a second repeating time interval.

6. The apparatus of claim 4, wherein each of the first and second DPDs comprise first and second sub-models defined by first and second DPD filters, the first and second sub-models being configured to predistort respective first and second subsets of frequency components of the input signal.

7. The apparatus of claim 6, wherein the first and second DPD filters are complementary half-band filters.

8. The apparatus of claim 1, further comprises for the common gain controller to determine and apply a common gain adjustment value based on:
(i) a first gain error based on comparing the measured power of first output signal with that of the first input signal;
(ii) a second gain error based on comparing the measured power of the second output signal with that of the second input signal, and
wherein the common gain adjustment value is based on the average of the first and second gain errors.

9. The apparatus of claim 8, further comprises the common gain controller to determine residual first and second gain errors associated with the first and second input signals subsequent to applying the common gain adjustment value.

10. The apparatus of claim 9, further comprises the common gain controller to determine and apply individual gain adjustment values for the respective first and second post-scaling controllers to reduce or substantially remove the residual first and second gain errors.

11. The apparatus of claim 1, further comprises the router to clip the respective first and second input signals prior to mixing so as not to exceed a predetermined peak to average value.

12. The apparatus of claim 1, wherein the two or more amplifiers (122, 124) are power amplifiers for connection to a common antenna (140).

13. The apparatus of claim 12, wherein the common antenna (140) is remote from the apparatus.

14. A method, comprising:
routing (704), at non-overlapping times, first and second output signals from respective first and second amplifiers to a common feedback path, the first and second amplifiers being for amplifying signals in two or more respective frequency bands;

causing linearizing (705) of received first and second input signals for the first and second amplifiers;

using a common gain controller for controlling a gain of a composite signal comprising the linearized first and second input signals prior to input to the first and second amplifiers;

using first and second post-scaling controllers for individually controlling the gain of the respective linearized first and second input signals.

15. A non-transitory computer readable medium comprising program instructions stored thereon for performing a method, comprising:

routing (704), at non-overlapping times, first and second output signals from respective first and second amplifiers to a common feedback path, the first and second amplifiers being for amplifying signals in two or more respective frequency bands;

causing linearizing (705) of received first and second input signals for the first and second amplifiers;

using a common gain controller for controlling a gain of a composite signal comprising the linearized first and second input signals prior to input to the first and second amplifiers; and using first and second post-scaling controllers for individually controlling the gain of the respective linearized first and second input signals.

\* \* \* \* \*